US008947162B2

(12) United States Patent
Wimpenny et al.

(10) Patent No.: US 8,947,162 B2
(45) Date of Patent: Feb. 3, 2015

(54) POWER CONTROL

(71) Applicant: Nujira Limited, Cambourne (GB)

(72) Inventors: Gerard Wimpenny, Cambourne (GB); Robert Henshaw, Cambourne (GB)

(73) Assignee: Nujira Limited (GB)

( * ) Notice: Subject to any disclaimer, the term of this patent is extended or adjusted under 35 U.S.C. 154(b) by 0 days.

(21) Appl. No.: 14/063,062

(22) Filed: Oct. 25, 2013

(65) Prior Publication Data

US 2014/0132345 A1    May 15, 2014

Related U.S. Application Data

(63) Continuation of application No. 13/372,823, filed on Feb. 14, 2012, now Pat. No. 8,570,105.

(30) Foreign Application Priority Data

Feb. 15, 2011 (GB) .................................. 1102621.8

(51) Int. Cl.
*H03G 3/20* (2006.01)
*H03F 1/02* (2006.01)
(52) U.S. Cl.
USPC ............................ 330/136; 330/297; 330/127
(58) Field of Classification Search
USPC ......................................... 330/136, 297, 127
IPC ...................................... H03F 1/02; H03G 3/20
See application file for complete search history.

(56) References Cited

U.S. PATENT DOCUMENTS

2010/0073088 A1    3/2010 Wimpeny et al.

FOREIGN PATENT DOCUMENTS

| GB | 2466218 A | 6/2010 |
|---|---|---|
| WO | 2009038975 A1 | 3/2009 |

OTHER PUBLICATIONS

Stefan Dietsche, "Related International Application No. PCT/EP2012/052264 International Preliminary Report on Patentability", Aug. 29, 2013, Publisher: PCT, Published in: EPO.
Intellectual Property Office, "British Search Report for International Application No. GB 1102621.8 dated Jun. 14, 2011", Jun. 14, 2011, Publisher: Intellectual Property Office, Published in: GB.

*Primary Examiner* — Patricia Nguyen
(74) *Attorney, Agent, or Firm* — Kaplan Breyer Schwarz & Ottesen, LLP

(57) ABSTRACT

An amplification stage comprising: an input scaling block for scaling an input signal based on an input scaling factor to generate a scaled version of the input signal; a power amplifier for receiving the scaled version of the input signal and for generating an amplified version of said signal; an envelope detector for generating a signal representing the envelope of the input signal; an envelope scaling block for scaling the envelope signal based on an envelope scaling factor to generate a scaled version of the envelope signal; a non-linear mapping block for generating a voltage representative of the supply voltage based on the scaled envelope signal; a modulator for generating a power supply voltage for the amplifier based on the voltage generated by the non-linear mapping block; and a power control block for maintaining a linear relationship between the envelope scaling factor and the input scaling factor.

18 Claims, 3 Drawing Sheets

POWER CONTROL

CROSS-REFERENCE TO RELATED APPLICATIONS

Patent application U.S. Ser. No. 13/372,823, filed Feb. 14, 2012, and Patent application GB 1102621.8, filed Feb. 15, 2011, are incorporated herein by reference.

BACKGROUND OF THE INVENTION

1. Field of the Invention

The present invention relates to power control in a power amplifier arrangement incorporating an envelope tracking power supply. The invention is particularly but not exclusively concerned with radio transmitter power control in mobile communication systems.

2. Description of the Related Art

A typical radio transmitter of a mobile communication system comprises baseband signal processing stages, an RF (radio frequency) up-converter, several amplification stages operating at RF frequencies and a following RF power amplifier stage (which may comprise one or more power amplifiers).

Such radio transmitters for mobile communications systems must be capable of setting the RF output power across a wide dynamic range. For example, a 3GPP ($3^{rd}$ Generation Partnership Project) WCDMA (wideband code division multiple access) transmitter must provide a power control range of >70 dB, typically from around +23 dBm down to around −50 dBm.

An envelope tracking radio transmitter operates by carefully controlling the supply voltage to the power amplifier stage, such that the supply voltage tracks the instantaneous RF envelope of the signal to be amplified with high accuracy. The instantaneous signal envelope is used to derive the power amplifier supply voltage. The mapping between signal envelope and supply voltage is designed to achieve certain performance objectives. This mapping is implemented using a non-linear transfer function, often termed a 'shaping table'

To date envelope tracking power supply systems for power amplifiers have focused on applications operating with a low power control range.

It is an aim of the invention to provide an improved envelope tracking power supply which provides for efficient operation with a high power control range.

SUMMARY OF THE INVENTION

There is provided an amplification stage comprising: an input scaling block for scaling an input signal in dependence on an input scaling factor to generate a scaled version of the input signal; a power amplifier for receiving the scaled version of the input signal and for generating an amplified version of said signal; an envelope detector for generating a signal representing the envelope of the input signal; an envelope scaling block for scaling the envelope signal in dependence on an envelope scaling factor to generate a scaled version of the envelope signal; a non-linear mapping block for generating a voltage representative of the supply voltage in dependence on the scaled envelope signal; a modulator for generating a power supply voltage for the amplifier in dependence on the voltage generated by the non-linear mapping block; and a power control block for maintaining a linear relationship between the envelope scaling factor and the input scaling factor.

The power control block may receive power control information, and generates the envelope scaling factor and the input scaling factor in dependence thereon.

The envelope scaling block may be a multiplier for multiplying the envelope signal by the envelope scaling factor.

The input scaling block may be a variable gain amplifier, the gain of the variable gain amplifier being controlled in dependence on the input scaling factor.

There may be further provided a mapping block for distributing the gain control information to two or more variable gain stages.

The envelope signal is further scaled in dependence on the difference between the voltage level at the output of the non-linear mapping block and the output of the voltage modulator.

The amplification stage may further comprise: a variable gain amplifier connected between the output of the non-linear mapping block and the input of the voltage modulator, the gain of the variable amplifier being determined in dependence on a difference between the voltage level at the output of the non-linear mapping block and the output of the voltage modulator.

The gain of the input scaling block may be further determined in dependence on the difference between the voltage level at the input of power amplifier and the voltage level defined by the power control information.

The invention provides a method in an amplification stage, comprising: scaling an input signal in dependence on an input scaling factor to generate a scaled version of the input signal; generating an amplified version of scaled version of the input signal; generating a signal representing the envelope of the input signal; scaling the envelope signal in dependence on an envelope scaling factor to generate a scaled version of the envelope signal; generating a voltage representative of the supply voltage in a non-linear mapping block in dependence on the scaled envelope signal; generating a modulated power supply voltage for the amplifier in dependence on the voltage generated by the non-linear mapping block; and maintaining a linear relationship between the envelope scaling factor and the input scaling factor.

The method may further comprise generating the envelope scaling factor and the input scaling factor in dependence on power control information.

The method may further comprise multiplying the envelope signal by the envelope scaling factor.

The method may further comprise controlling the gain of a variable gain amplifier in dependence on the input scaling factor.

The method may further comprise distributing the gain control information to two or more variable gain stages using a mapping function.

The may further comprise scaling the envelope signal in dependence on the difference between the voltage level at the output of the non-linear mapping block and the output of the voltage modulator.

The amplification stage may further comprise scaling the input signal further in dependence on the difference between the voltage level at the input of power amplifier and the voltage level defined by the power control information.

The input path is preferably an RF input path.

BRIEF DESCRIPTION OF THE DRAWINGS

The invention will now be described by way of example with reference to the accompanying Figures, in which.

DESCRIPTION OF THE PREFERRED EMBODIMENTS

The present invention is described herein by way of reference to particular advantageous arrangements, embodiments and implementations. The invention is not limited to the details of such arrangements. In particular the invention is described in relation to an envelope tracking power supply for an RF power amplifier of a mobile communications system in which power control is provided. This represents an exemplary implementation, and the invention is not limited to such an implementation.

Figure 1:
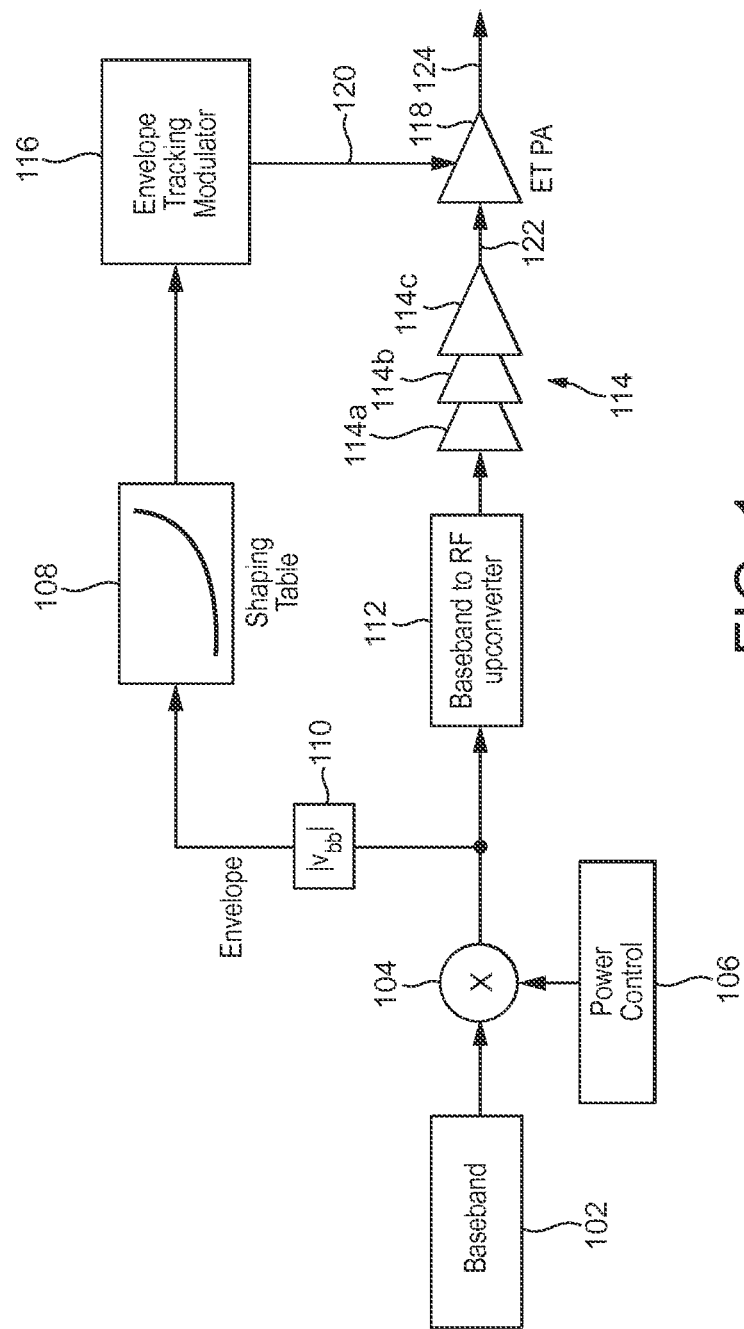
FIG. 1 illustrates the incorporation of power control in the RF path of an envelope tracking power supply in accordance with prior art techniques.

FIG. 1 illustrates an envelope tracking system incorporating power control for the signals to be amplified.

A baseband processing subsystem 102 provides baseband data to be transmitted to one input of a multiplier 104. Power control data, such as an uplink power control level data, is provided from a power control block 106 to a second input of the multiplier 104. The multiplier 104 generates at its output the baseband data to be transmitted adjusted according to the power control data.

The power-adjusted baseband data at the output of the multiplier is provided as an input to a baseband to RF up-converter stage 112. The RF signal at the output of the RF up-converter stage 112 is provided as an input to an amplification stage 114 comprising a plurality of amplifiers, in the illustrated example three amplifiers 114a, 114b, 114c. The amplification stage 114 provides pre-amplification of the RF signal to provide the input to an RF power amplifier 118 on line 122. The RF power amplifier 118 provides an RF output signal on its output on line 124.

In accordance with a preferred implementation of an envelope tracking power supply, the output of the multiplier 104 is also provided as an input to an envelope detector 110. The envelope detector generates an envelope signal, representing the envelope of the baseband signal to be amplified, at its output.

The envelope signal is provided as an input to a shaping table 108. The shaping table 108 implements a non-linear mapping function between its input and output to provide the shaped input to an envelope tracking modulated power supply 116. The envelope tracking modulated power supply 116 provides a power supply voltage on line 120 to a power supply terminal of the power amplifier 118, which voltage tracks the envelope of the signal to be amplified in order to provide efficient operation of the power amplifier 118.

The shaping table 108 determines an instantaneous output voltage for the envelope tracking modulated power supply 116 in dependence on characteristics of the instantaneous envelope signal. The shaping table 108 has an x-axis representing RF input voltage, and a y-axis representing voltage supply. Thus for a given RF envelope voltage a corresponding power amplifier voltage supply level is determined.

Figure 2:
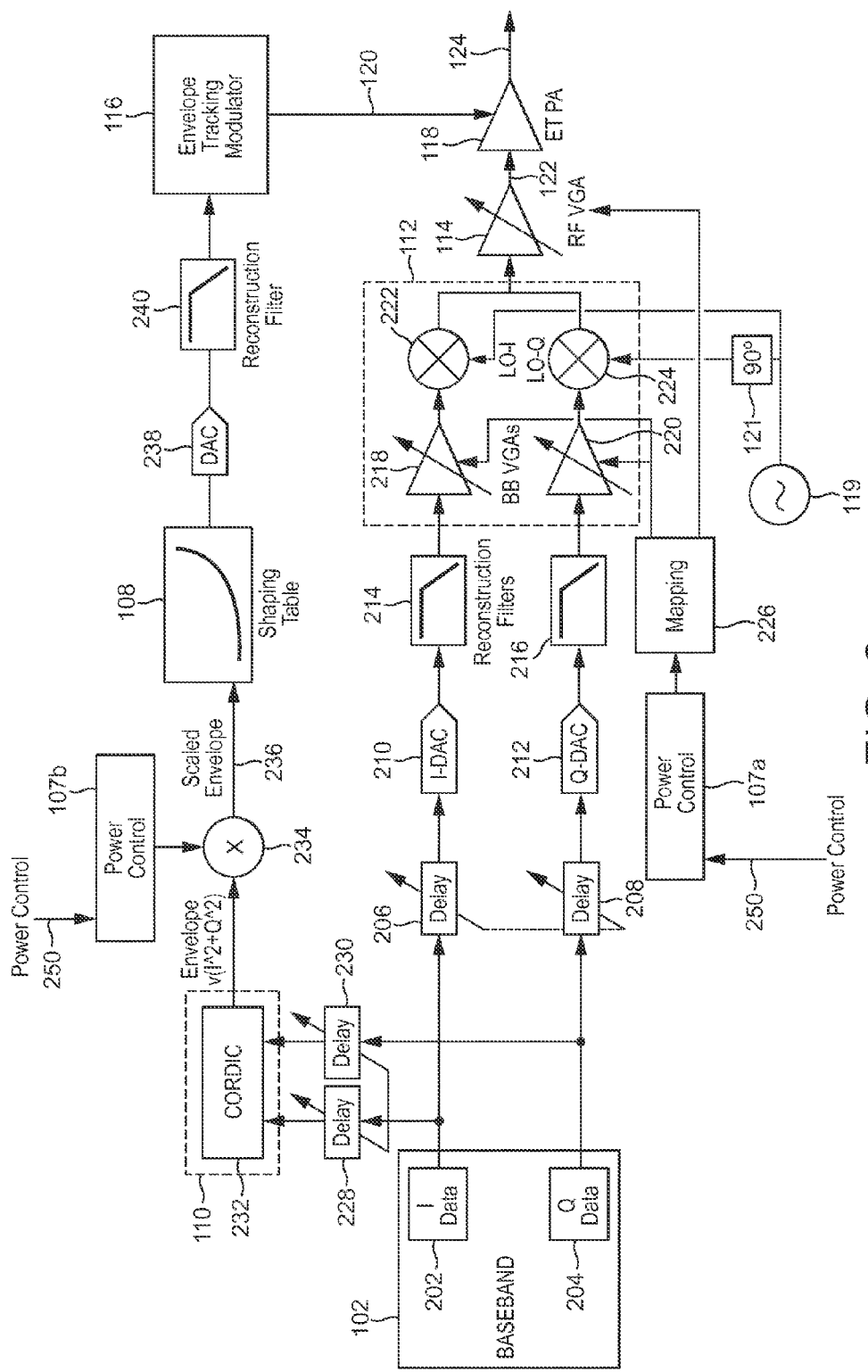
FIG. 2 illustrates the incorporation of power control in the envelope path of an envelope tracking power supply in accordance with an embodiment of the invention.

With reference to FIG. 2, there is illustrated an improvement to the prior art arrangement of FIG. 1 to utilise power control information in accordance with an embodiment of the invention. Reference numerals in FIG. 2 which correspond to reference numerals in FIG. 1 denote elements in FIG. 2 corresponding to elements in FIG. 1.

The baseband processing subsystem 102 generates I data and Q data signals in respective sub-blocks 202 and 204. In the path to the input of the RF amplifier 118 (the RF path), the I data signal is connected to a delay block 206 and the Q data signal is connected to a delay block 208. In the path to the envelope tracking modulated power supply 116 (the envelope path), the I data signal is connected to a delay block 228 and the Q data signal is connected to a delay block 230.

The delay blocks 228, 230, 206 and 208 are optionally provided to enable delay balance between the RF path and the envelope path. The control of the delay blocks is not described herein, as it falls outside the scope of the present invention and will be familiar to one skilled in the art. Typically the delay blocks are provided (or enabled) in only one or other of the RF path or the envelope path.

In the RF path to the RF amplifier, after the optional delay block 206 the I data signal is provided as an input to an analogue-to-digital converter 210, and then the generated analogue signal is reconstructed in a reconstruction filter 214 for the analogue signal based on the I data signal. After the delay block 208 the Q data signal is provided as an input to an analogue-to-digital converter 212, and then the generated analogue signal is reconstructed in a reconstruction filter 216 for the analogue signal based on the Q data signal.

An RF power control path comprises the RF up-converter 112 and the amplification stage 114. The RF up-converter 112 includes a variable gain amplifier 218 connected to receive the analogue signal based on the I data signal from the reconstruction filter 214, and a variable gain amplifier 220 connected to receive the analogue signal based on the Q data signal from the reconstruction filter 216. As discussed further hereinbelow, each of the variable gain amplifiers 218 and 220 further receive variable gain control signals.

The respective outputs of the variable gain amplifiers 218 and 220 drive respective quadrature mixers 222 and 224. The quadrature mixer 222, associated with the I data signal, receives an oscillator signal from a local oscillator 119 (for up-conversion). The quadrature mixer 224, associated with the Q data signal, receives the oscillator signal from the local oscillator 119, shifted 90° by phase shifter 121.

The outputs of the quadrature mixers 222 and 224 are combined to form the input for the amplification stage 114.

The amplification stage 114 is denoted as a variable gain amplifier, which may comprise a plurality of amplifier stages as in FIG. 1, and amplifies the combined output of RF up converter 112 to provide the input signal for amplification by the RF power amplifier 118.

An RF power control block 107a receives power control information on signal line 250. The RF power control block 107a is adapted to provide power control information for the RF input path. The RF power control block receives the power control information, and generates a version of the power control information for use in the RF input path. The RF input power control block generates the power control information on signal lines 250 in a form for delivery to the RF input path, which in the example shown is a signal to be applied to the mapping block 226.

More specifically, in the arrangement of FIG. 2 the RF power control block 107a provides power control information to a mapping block 226. The mapping block 226 generates first power control information data to control the variable gain of the baseband variable gain amplifiers 218 and 220, and second power control information data to control the variable gain of the amplification stage 114.

The mapping block 226 includes a function, such as a table, for generating control signals to the variable gain amplifiers for a given set of power control information. In a mobile communications system, where the arrangement of FIG. 2 is implemented in a handset, the level set by the RF power control block 107*a* is controlled by information transmitted to the handset from the network infrastructure.

In the path to the envelope tracking modulated power supply 116, after the optional delay stages 228 and 230 the I and Q data signals are provided as inputs to the envelope detector 110. In the illustrated embodiment the envelope detector includes a CORDIC (COordinate Rotation DIgital Computer) function for generating the envelope signal. CORDIC is a simple and efficient algorithm to calculate hyperbolic and trigonometric functions. It is commonly used when no hardware multiplier is available as the only operations it requires are addition, subtraction, bit-shift and table lookup. More generally the envelope detector may include an "abs" function, CORDIC being a particular implementation of this.

An envelope power control block 107*b* receives the power control information on signal line 250 (which is also provided to the power control block 107*a*). The envelope power control block 107*b* is adapted to provide power control information for the envelope path. The envelope power control block receives the power control information, and generates a version of the power control information for use in the envelope path. The envelope power control block generates the power control information on signal lines 250 in a form for delivery to the envelope path, which in the example shown is a signal to be applied to the multiplier 234.

The RF and envelope power control blocks 107*a* and 107*b* thus receive common power control information, and independently generate a linearly scaled version of it, which is delivered to be multiplied with the respective RF and envelope signals (via a mapping means in the RF path) in order to scale the RF and envelope signals to follow the power control information.

The envelope signal at the output of the envelope detector 110 is provided as a first input to a multiplier 234. The second input of the multiplier 234 is the power control information provided by the envelope power control block 107*b*. The power control information provided to the envelope power control block 107*b* is linearly related to the power control information provided to the RF power control block 107*a*.

The scaled envelope signal from the multiplier 234 on line 236 provides the input to the shaping table 108. The output of the shaping table is provided as an input to a digital-to-analogue converter 238, and the thus generated analogue signal is processed in a reconstruction filter 240 and then provided as the input to the envelope tracking modulated power supply 116. The envelope tracking modulated power supply then provides the power supply voltage to the RF amplifier 118 on line 120 in dependence on the output voltage value provided by the shaping table.

The power control provided in the RF path to the RF amplifier is implemented in the analogue domain in the arrangement of FIG. 2, in accordance with prior art techniques.

In the envelope path, power control is implemented in the digital domain. This is determined by a requirement to implement the scaling of the envelope signal before the shaping table. If the scaling of the envelope signal were implemented after the shaping table, i.e. by scaling the power amplifier supply voltage itself (the voltage from the shaping table), this would not achieve the same non-linear mapping owing to the characteristics of the shaping table. The scaling in the envelope path may therefore be implemented at any point between the baseband conversion of the signals and the input to the shaping table.

Preferably the baseband signals are maintained as large as possible for signal processing, and therefore the shaping of the envelope signal is preferably implemented as close to the input of the shaping table as possible.

The invention thus operates by scaling the envelope voltage fed into the shaping table. In the illustrated embodiment this scaling is therefore done by scaling the envelope signal itself before it passes to the shaping table. In an alternative arrangement this may be done by scaling the baseband I-Q voltages prior to calculation of the envelope. Gain control in the main RF path is still preferably implemented, as shown in FIG. 2 with amplifiers 114.

The scaling of the envelope signal in dependence on power control information determines the range of the shaping table which can be utilised. Power control information which determines a reduced power, for example, limits the upper range of the shaping table which is accessed.

Thus the envelope path is adapted to scale the voltage in the envelope path depending on the target average output power based on a power control signal delivered on signal line 250.

Specifically, the envelope voltage fed into the 'shaping table' 108 is scaled with output power information.

For example, in a mobile communication system implementation, where the arrangement of FIG. 2 is implemented in a handset, if the network demands a 20 dB power reduction, and transmits an appropriate power control command to the handset, the envelope voltage fed into the multiplier 234 is multiplied by a factor of 0.1 before being delivered to the shaping table 108. Thus the envelope power control block 107*b* generates the appropriate scaling signal for the multiplier 234 in dependence upon the power control information on signal line 250. At the same time, based on the same power control information delivered on signal line 250 to the RF input power control block 107*a*, the RF input voltage must be also be multiplied by a factor of 0.1. This is achieved by controlling the composite gain of the baseband VGAs 218 and 220 and the RF VGA 114.

Thus it can be understood in general that the signals in the envelope and RF paths are both scaled by the same amount based on received power control information, with the scaling factor applied in any particular stage being linearly related to an overall scaling objective determined by common power control information.

The present invention extends an envelope tracking power supply system to provide improved operation across a range of average output powers. The power control information provided to the envelope path (and the RF path) preferably represents the current average output power requirements.

In a terminal of a mobile communication system, the terminal can adjust its transmit power in response to commands issued by the network, by changing the gain in the RF and envelope paths as discussed.

The embodiments of the invention described herein illustrate a solution of implementing average tracking RF power control in radio transmitters using feed-forward envelope tracking, but is also applicable in closed-loop arrangements.

Figure 3:
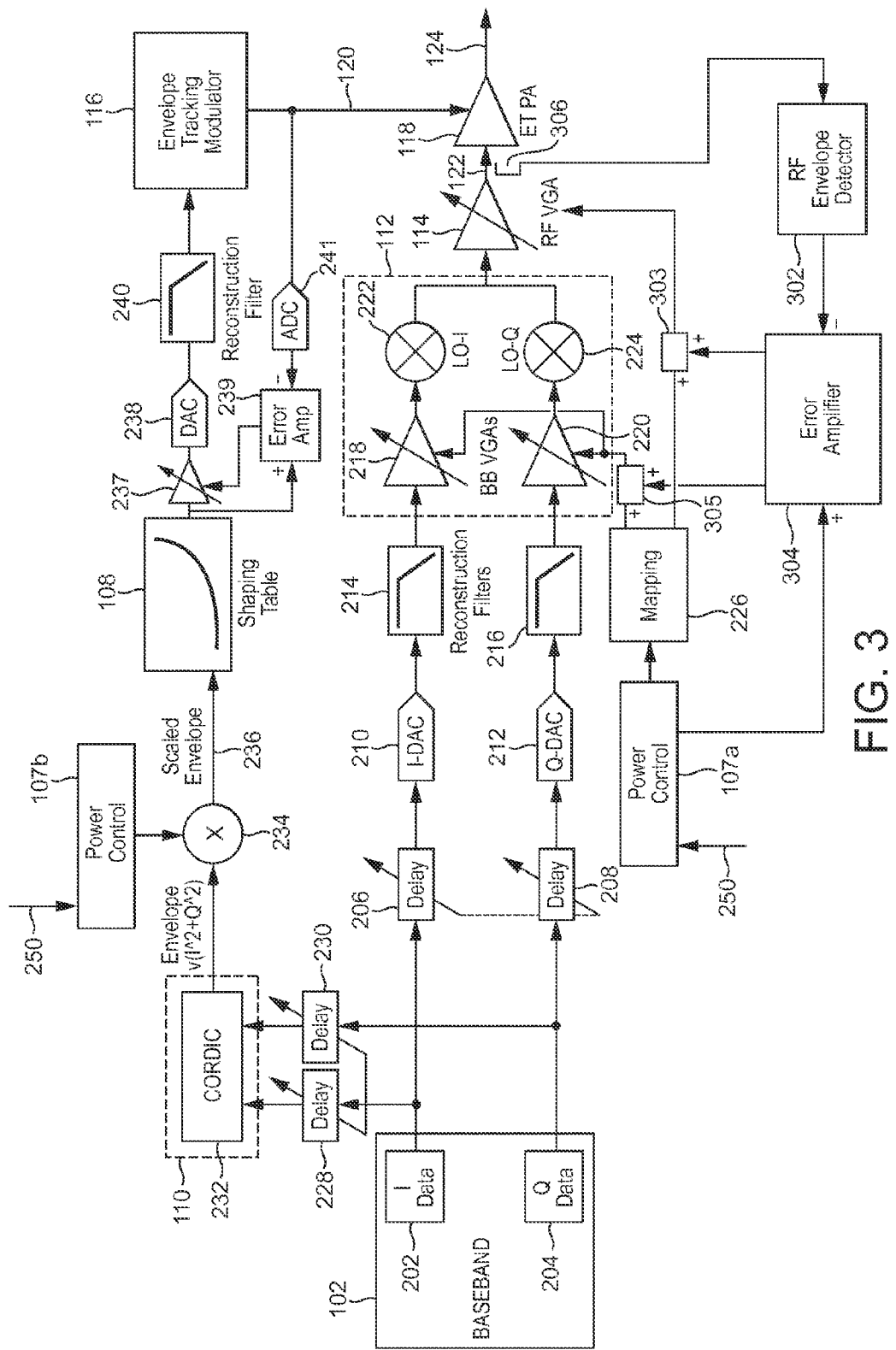
FIG. 3 illustrates the incorporation of power control in the envelope path of an envelope tracking power supply incorporating closed-loop power control in accordance with another embodiment of the invention.

FIG. 3 illustrates an embodiment of the invention in a closed loop implementation.

In FIG. 3, the arrangement of FIG. 2 is modified to include feedback to allow for power control in a closed loop implementation. If feedback were only taken from the output of the RF power amplifier 118 in order to implement the closed loop implementation, it is not possible to directly determine whether the error in the level of the output signal results from gain errors in the envelope path or gain errors in the RF path. This problem may be overcome by taking feedback from two points, so as to be able to distinguish the path in which a gain error arises, and provide feedback to control the gain of that path. FIG. 3 represents a particular way of implementing this, in which feedback for the envelope path is taken from the supply fed to the power amplifier at the output of the envelope tracking modulator 116, and feedback from the RF path is taken from the input of the RF power amplifier on line 122.

In order to provide closed loop control in the RF path gain, a feedback arrangement comprising RF envelope detector 302, error amplifier 304, combiner 303 and combiner 305 is provided. A power coupler 306 is connected to detect the power on the input to the power amplifier on line 122. The power coupler 306 delivers the detected power signal to the RF envelope detector 302. The RF envelope detector 302 generates an envelope signal representing the envelope of the signal at the input to the RF power amplifier, and delivers this as one input to an error amplifier 304. The error amplifier 304 further receives an input from the power control block 107*a*, representing the power control information currently being delivered by the power control block 107*a*. The error amplifier 304 amplifies an error corresponding to the difference in the signals received at its two inputs, and generates two respective outputs to the combiner blocks 303 and 305. The output of the error amplifier 304 provided to the combiner 303 is combined with the output of the mapping block 226 for the variable gain amplifier 114, in order to generate a modified variable gain control signal for the RF variable gain amplifier 114. The output of the error amplifier 304 provided to the combiner 305 is combined with the output of the mapping block 226 to generate a modified variable gain signal for the baseband variable gain amplifiers 218 and 220.

In this way, any error in the gain of the RF path can be removed. It should be noted that this includes errors due to non-linearities in the gain control characteristics of the baseband amplifiers 218 and 220 and the RF variable gain amplifier 114.

In order to provide for closed loop operation in the envelope path, a feedback arrangement is provided including an analogue-to-digital converter 241, an error amplifier 239, and a variable gain amplifier 237. The variable gain amplifier 237 is connected between the output of the shaping table 108 and the input to the digital-to-analogue converter 238. The analogue-to-digital converter 241 is connected to receive the signal at the output of the envelope tracking modulator 116, or the signal at the power supply input to the amplifier 118, on line 120. This converted digital signal is delivered as one input to the error amplifier 239. The other input to the error amplifier is provided by the output of the shaping table 108. The error amplifier amplifies the difference between the signals at its two inputs in order to control the gain of the variable amplifier 237.

In this way any error in the gain of the envelope path through to the output of the envelope tracking modulator 116 is removed.

It will be understood that variations to the specific points at which the signals of the RF power amplifier are sensed in order to provide feedback may be varied. As noted above, it is undesirable to only detect the output of the RF power amplifier because this does not provide information as to which path the error is in. However if the error in one path is detected and corrected, then the other path may be corrected based on making a detection of the output of the RF power amplifier. For example, in the arrangement of FIG. 3, the closed loop arrangement in the envelope path removes any error in the signal provided on the supply voltage line 120 to the RF power amplifier. In this case it may be assumed that any error in the output of the RF power amplifier on line 124 is associated with the RF input path, and therefore the power coupler 306 may be connected on output line 124 rather than output line 122.

The implementation of the RF envelope detector 302 falls outside the scope of the present invention, and one familiar with the art will appreciate how such implementation may be achieved. It is envisaged that the RF envelope detector 302 may include a receive chain, an analogue-to-digital converter, and a magnitude detector, to provide a digital signal to the input of the error amplifier representing the envelope of the input signal to the RF amplifier.

In the arrangement of FIG. 3, the power control information signal is preferably adjusted based on the feedback signal, so that one scaling is still applied to the envelope signal, rather than two scalings being applied to the envelope signal.

The invention has been described herein by way of example with reference to exemplary arrangements of an envelope tracking modulated power supply for a power amplifier, and with particular reference to implementation in a handset of a mobile communication system. One skilled in the art will appreciate that the invention is not limited to such an implementation. For example, the invention could be implemented in the network side of a mobile communication system, such as in a base station. Network planning load-balance considerations to suit local traffic conditions could determine the power control information, which could be assessed dynamically. The invention is further not limited to mobile communication applications.

In the Figures the power control blocks 107*a* and 107*b* are shown as receiving common power control information on signal lines 250. This power control information may be provided in accordance with various arrangements, some of which are described hereinabove. Each power control block 107*a* and 107*b* adapts the received power control information in order to provide it in an appropriate form of data for application in the respective envelope or RF path. Whilst the power control blocks 107*a* and 107*b* adapt the power control information to the appropriate form the for the respective paths, the power control blocks 107*a* and 107*b* are linearly related to each other such that a linear relationship is maintained between the scaling factors applied in the respective paths.

The present invention has been described herein by way of example, with reference to particular non-limiting embodiments. Whilst the invention has particular applicability in mobile communication systems, and in particular mobile communication handsets, the invention is not limited to such applications. One skilled in the art will appreciate the more general applicability of the invention and its embodiments as described herein, and the scope of protection afforded by the invention as defined by the appended claims.

What is claimed is:

1. An amplification stage comprising:
a power amplifier for receiving a scaled version of an input signal and for generating an amplified version of said signal; and
a modulator for generating a power supply voltage for the amplifier in dependence on a scaled envelope signal, the amplification stage being configured to receive power control information, and generate an envelope scaling factor and an input scaling factor whilst maintaining a relationship between the envelope scaling factor and the input scaling factor in dependence on the received power control information.

2. The amplification stage of claim 1 wherein an envelope scaling block comprises a multiplier for multiplying the envelope signal by the envelope scaling factor.

3. The amplification stage of claim 1 wherein an input scaling block comprises a variable gain amplifier, the gain of the variable gain amplifier being controlled in dependence on the input scaling factor.

4. The amplification stage of claim 3 wherein there is further provided a mapping block for distributing the gain control information to two or more variable gain stages.

5. The amplification stage of claim 1, wherein the envelope signal is further scaled in dependence on the difference between the voltage level at the output of a non-linear mapping block, which generates an input to the modulator in dependence on the scaled envelope signal, and the output of the modulator.

6. The amplification stage of claim 5, further comprising:
a variable gain amplifier connected between the output of the non-linear mapping block and the input of the modulator, the gain of the variable amplifier being determined in dependence on a difference between the voltage level at the output of the non-linear mapping block and the output of the modulator.

7. The amplification stage of claim 1, wherein the gain of an input scaling block for scaling the input signal is further determined in dependence on the difference between the voltage level at the input of power amplifier and the voltage level defined by the power control information.

8. A method in an amplification stage, comprising
scaling an input signal in dependence on an input scaling factor to generate a scaled version of the input signal;
generating an amplified version of scaled version of the input signal;
generating a signal representing the envelope of the input signal;
scaling the envelope signal in dependence on an envelope scaling factor to generate a scaled version of the envelope signal;
generating a voltage representative of the supply voltage in a non-linear mapping block in dependence on the scaled envelope signal;
generating a modulated power supply voltage for the amplifier in dependence on the voltage generated by the non-linear mapping block;
receiving power control information; and
maintaining a relationship between the envelope scaling factor and the input scaling factor in dependence on the power control information.

9. The method of claim 8 wherein further comprising multiplying the envelope signal by the envelope scaling factor.

10. The method of claim 8 further comprising controlling the gain of a variable gain amplifier in dependence on the input scaling factor.

11. The method of claim 10 further comprising distributing the gain control information to two or more variable gain stages using a mapping function.

12. The method of claim 8, further comprising scaling the envelope signal in dependence on the difference between the voltage level at the output of the non-linear mapping block and the output of the voltage modulator.

13. The amplification stage of claim 8, further comprising scaling the input signal further in dependence on the difference between the voltage level at the input of power amplifier and the voltage level defined by the power control information.

14. The amplification stage of claim 1 further comprising an input scaling block for scaling the input signal in dependence on the input scaling factor.

15. The amplification stage of claim 1 further including: an envelope detector for generating a signal representing an envelope of the input signal; an envelope scaling block for scaling the envelope signal in dependence on the envelope scaling factor to generate the scaled version of the input envelope signal; and a non-linear mapping block for generating a voltage representative of the supply voltage, in dependence on the scaled envelope signal, for the modulator.

16. The amplification stage of claim 1 further comprising a power control block for receiving the power control information.

17. The amplification stage of claim 1 wherein the amplification stage is further configured to maintain a substantially linear relationship between the envelope scaling factor and the input scaling factor to generate the scaled version of the input signal.

18. The method of claim 8 wherein the relationship is a substantially linear relationship.

* * * * *